(12) United States Patent
Samaniego

(10) Patent No.: US 10,996,566 B2
(45) Date of Patent: May 4, 2021

(54) APPLIANCE FOR THE MOIRÉ MEASUREMENT OF AN OPTICAL TEST OBJECT

(71) Applicant: Carl Zeiss SMT GmbH, Oberkochen (DE)

(72) Inventor: Michael Samaniego, Oberkochen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/242,388

(22) Filed: Jan. 8, 2019

(65) Prior Publication Data
US 2019/0187564 A1    Jun. 20, 2019

Related U.S. Application Data

(63) Continuation of application No. PCT/EP2017/064092, filed on Jun. 9, 2017.

(30) Foreign Application Priority Data

Jul. 8, 2016   (DE) .................. 10 2016 212 462.5

(51) Int. Cl.
*G03F 7/20* (2006.01)
*G01M 11/02* (2006.01)
(Continued)

(52) U.S. Cl.
CPC ......... *G03F 7/706* (2013.01); *G01M 11/0264* (2013.01); *G02B 27/60* (2013.01);
(Continued)

(58) Field of Classification Search
CPC ..................................................... G03F 7/706
(Continued)

(56) References Cited

U.S. PATENT DOCUMENTS

| | | | |
|---|---|---|---|
| 4,102,578 A | * | 7/1978 | Suzuki ................. G01B 11/306 356/429 |
| 5,724,121 A | | 3/1998 | McKinley et al. |

(Continued)

FOREIGN PATENT DOCUMENTS

| | | |
|---|---|---|
| DE | 10253874 A1 | 5/2004 |
| DE | 102005041373 A1 | 6/2006 |

(Continued)

OTHER PUBLICATIONS

PCT International Preliminary Report on Patentability, PCT/EP2017/064092, dated Jan. 8, 2019, 10 pages.
(Continued)

*Primary Examiner* — Tarifur R Chowdhury
*Assistant Examiner* — Omar H Nixon
(74) *Attorney, Agent, or Firm* — Edell, Shapiro & Finnan, LLC

(57) ABSTRACT

An appliance for moiré measurement of an object (12) includes a grating arrangement having a first grating (11) positioned upstream of the object and including test structures to be imaged, a second grating (14) positioned downstream of the object, and an evaluation unit having at least one detector evaluating moiré structures produced by superposing the two gratings in a detection plane situated downstream of the second grating. The object is an anamorphic imaging system, and the respective grating periods of the first grating and of the second grating are selected so that the grating period of the second grating corresponds to a common multiple or a common divisor of the respective periods of two test structure images of the test structures of the first grating produced by the imaging system in two different measurement positions. The two measurement positions differ in relative grating arrangement position and test object position.

16 Claims, 12 Drawing Sheets

(51) Int. Cl.
    *G02B 27/60*     (2006.01)
    *G02B 13/08*     (2006.01)

(52) U.S. Cl.
    CPC ...... *G03F 7/70225* (2013.01); *G03F 7/70283* (2013.01); *G02B 13/08* (2013.01)

(58) Field of Classification Search
    USPC .......................................................... 356/124
    See application file for complete search history.

(56) References Cited

U.S. PATENT DOCUMENTS

| | | | |
|---|---|---|---|
| 5,724,259 A * | 3/1998 | Seymour | B41F 33/0036 |
| | | | 101/211 |
| 5,767,959 A | 6/1998 | Kobayashi | |
| 6,816,247 B1 | 11/2004 | Heppner et al. | |
| 10,012,911 B2 | 7/2018 | Arnz et al. | |
| 2005/0122506 A1 | 6/2005 | Wegmann et al. | |
| 2010/0033811 A1* | 2/2010 | Westphal | G02B 7/36 |
| | | | 359/368 |
| 2011/0063592 A1 | 3/2011 | Ezura et al. | |
| 2012/0015461 A1* | 1/2012 | Donaher | G03F 7/706 |
| | | | 438/16 |
| 2015/0377798 A1 | 12/2015 | Zhu et al. | |

FOREIGN PATENT DOCUMENTS

| | | |
|---|---|---|
| DE | 102014226269 A1 | 6/2016 |
| WO | 03076891 A2 | 9/2003 |
| WO | 2006125576 A2 | 11/2006 |
| WO | 2006125600 A1 | 11/2006 |
| WO | 2015100896 A1 | 7/2015 |
| WO | 2015124372 A2 | 8/2015 |
| WO | 2016097048 A1 | 6/2016 |

OTHER PUBLICATIONS

International Search Report, PCT/EP2017/064092, date of completion Oct. 6, 2017, 15 pages.
GPTO Office Action, English Translation, German Patent Application No. 10 2016 212.462.5, dated Mar. 29, 2017, 3 pages.
TW Search Report, 106119634, (2016) citing prior art, 1 page.
TW Office Action with English Translation, Application No. 106119634, (2021), 10 pages.

* cited by examiner

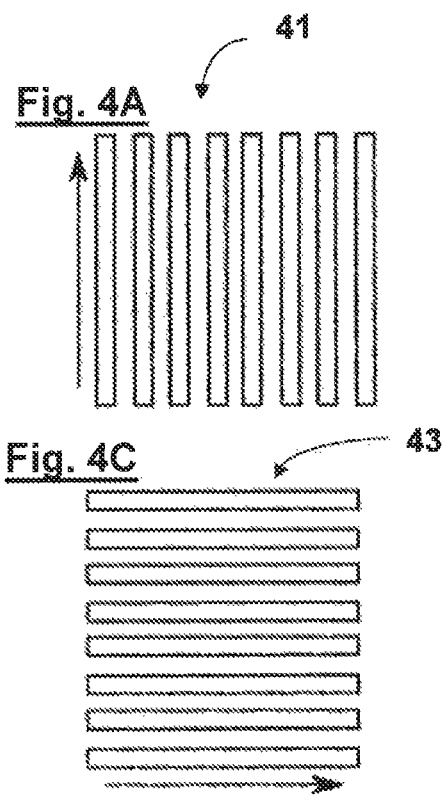
Fig. 4A  41
Fig. 4C  43
Fig. 4E  45
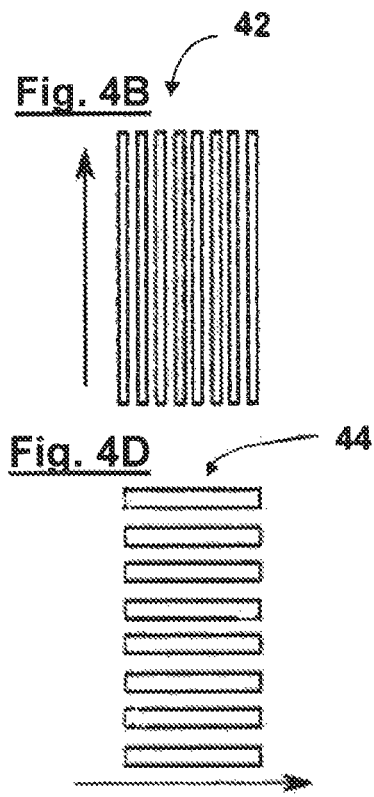
Fig. 4B  42
Fig. 4D  44
Fig. 4F  46

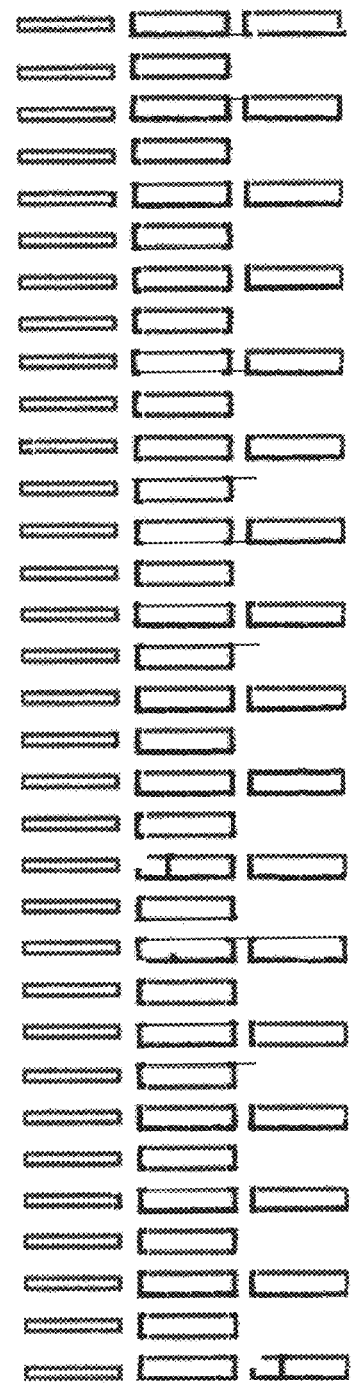

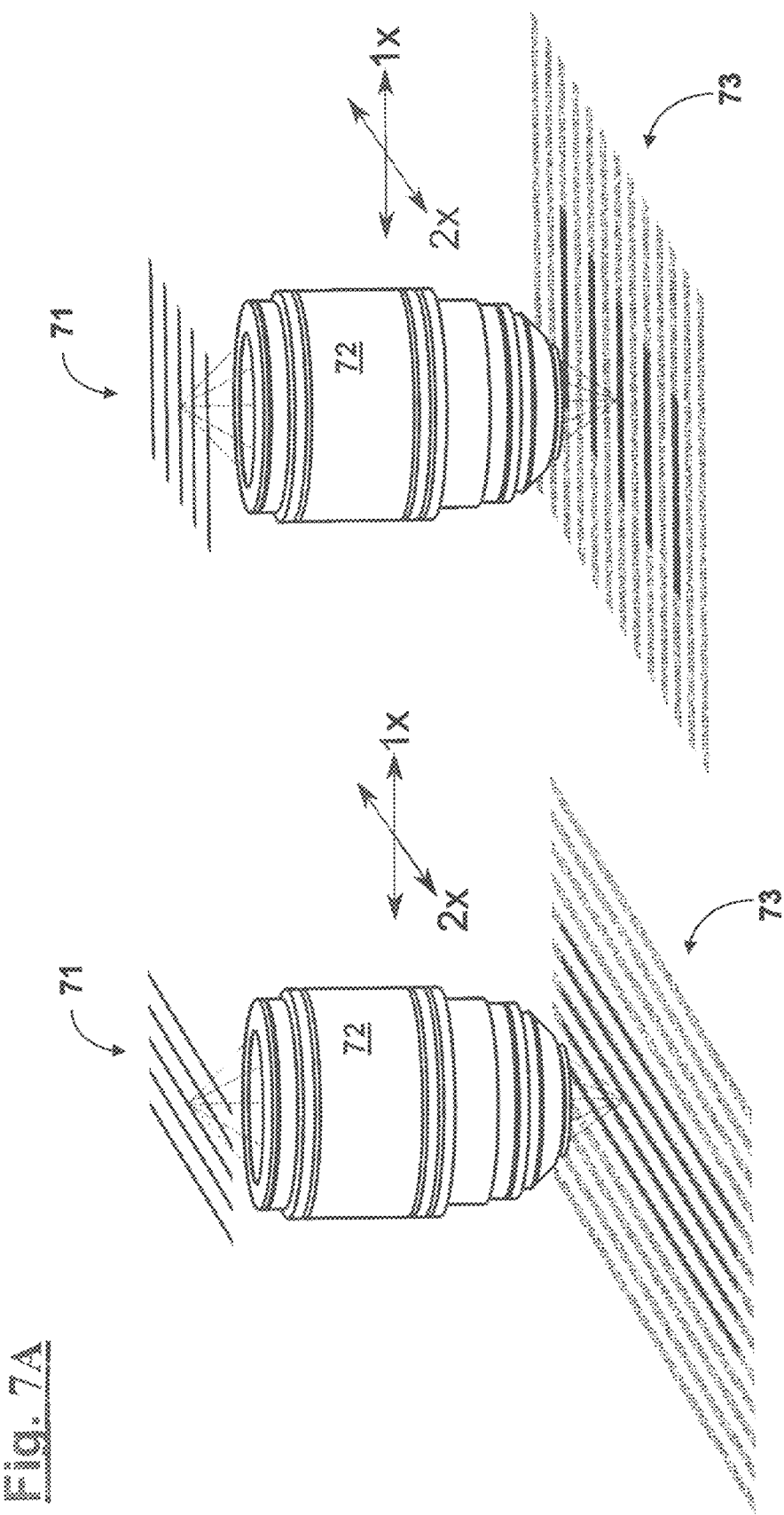

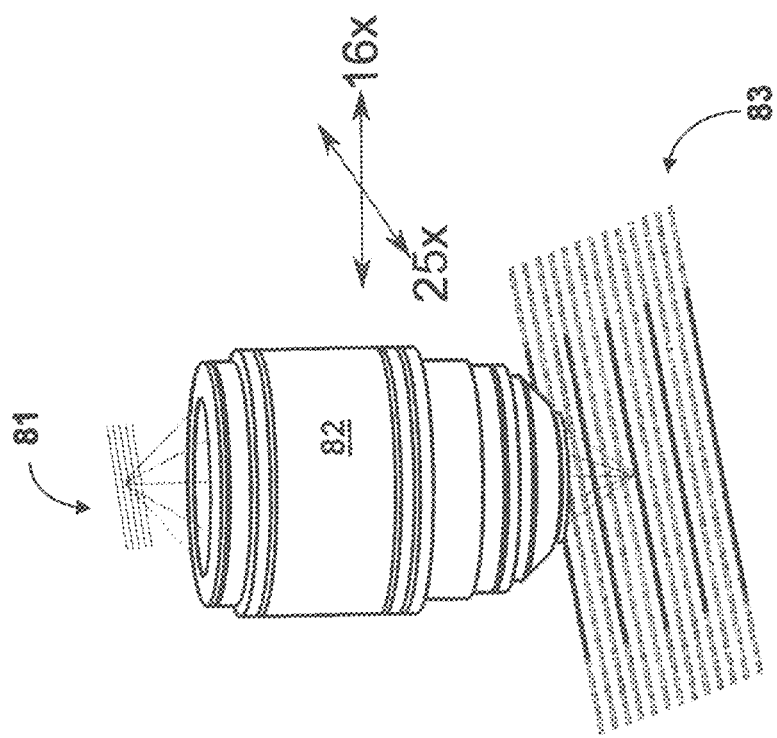
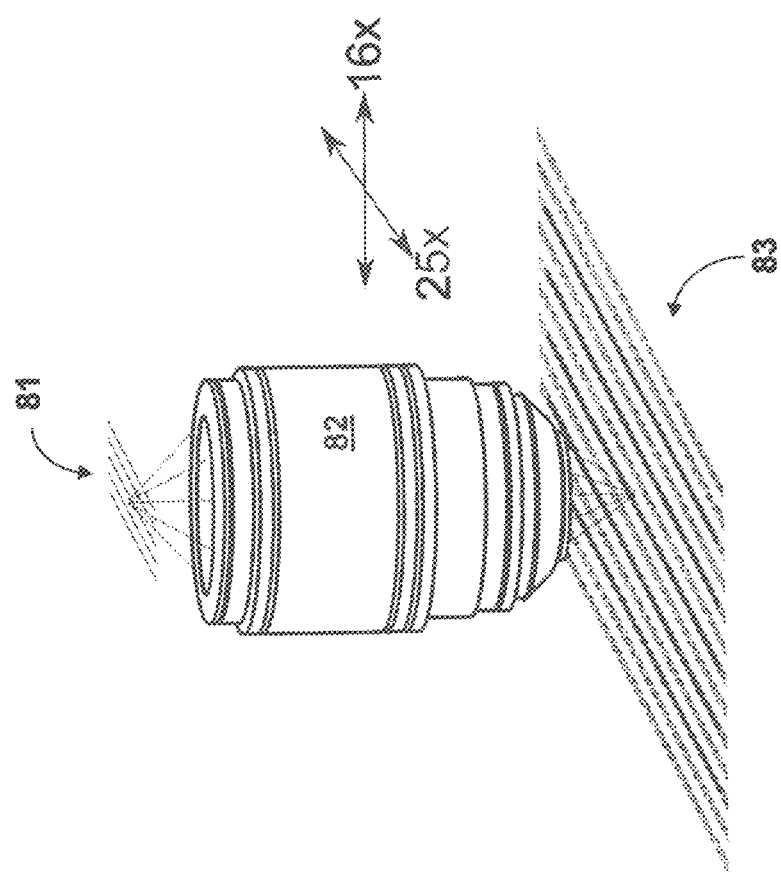
Fig. 7B

APPLIANCE FOR THE MOIRÉ MEASUREMENT OF AN OPTICAL TEST OBJECT

CROSS REFERENCE TO RELATED APPLICATIONS

This is a Continuation of International Application PCT/EP2017/064092, which has an international filing date of Jun. 9, 2017, the disclosure of which is incorporated in its entirety into the present Continuation by reference. This Continuation also claims foreign priority under 35 U.S.C. § 119(a)-(d) to German Patent Application DE 10 2016 212 462.5 filed on Jul. 8, 2016. The entire contents of this priority application are also incorporated into the present Continuation by reference.

FIELD OF THE INVENTION

The invention relates to an appliance for the moiré measurement of an optical test object.

BACKGROUND

Microlithography is used for producing microstructured components such as, for example, integrated circuits or LCDs. The microlithography process is carried out in a so-called projection exposure apparatus comprising an illumination device and a projection lens. The image of a mask (reticle) illuminated by the illumination device is in this case projected by the projection lens onto a substrate (for example a silicon wafer) coated with a light-sensitive layer (photoresist) and arranged in the image plane of the projection lens, in order to transfer the mask structure to the light-sensitive coating of the substrate.

In practice, there is a need to determine optical aberrations, such as e.g. the distortion of the projection lens, as exactly as possible. In particular, the technique of a moiré measurement is known in this respect, said technique comprising the projection of a first grating arranged in an object plane of the projection lens onto a second grating (also referred to as "moiré mask") arranged in the image plane of the projection lens and the measurement of the light intensity respectively transmitted through this arrangement using an (e.g. camera-based) detector arrangement.

FIGS. 8 and 9 show merely schematic illustrations for explaining this principle. Here, the first grating situated in the object plane of the test object in the form of a projection lens 6 is denoted by "5", the produced image of the test structures contained in the first grating 5 is denoted by "7" and the second grating or the moiré mask is denoted by "8". As a rule, the planes of the test structure image on the one hand and of the second grating 8 or of the moiré mask on the other hand coincide and are depicted with spatial separation in FIGS. 8 and 9 only for the purposes of a better illustration. The light distribution 10 (which in accordance with FIG. 9 typically has a characteristic stripe pattern) obtained downstream of the second grating 8 or of the moiré mask in the light propagation direction is determined by way of a detector arrangement 9. Here, in the case of an appropriate design of the grating arrangement made of the first grating and the second grating, the transmitted light intensity in the case of aberration-free imaging is at a maximum and it is reduced in the case where optical aberrations of the projection lens 6 are present since the light from bright regions of the test structures contained in the first grating 5 are increasingly incident on dark regions of the second grating 8 or of the moiré mask in the case of aberration-afflicted imaging.

Different measurement and evaluation methods based on the moiré measurement are known for ascertaining the respectively relevant optical aberrations of the test object or projection lens.

However, what needs to be taken into account here in practice is that the respective measurement signals obtained with the detector arrangement 9 during the aforementioned moiré measurement are not only determined by optical aberrations of the test object or projection lens 6 to be measured, but may possibly also be influenced by manufacturing faults of the first grating 5 containing the test structures and/or of the second grating 8 forming the moiré mask. This is because a consequence of such manufacturing faults is that the respective gratings 5, 8 no longer "fit to one another" in respect of the caused superposition, even in the case of aberration-free imaging by the projection lens 6, and hence fabricate the presence of an optical aberration of the test object in the respectively obtained measurement results.

In order to overcome this problem, it is known to carry out a so-called calibration method, in which—as indicated in FIG. 10—the test object or projection lens 6 is measured in a plurality of different measurement positions, wherein these measurement positions differ from one another in respect of the positioning of the test object relative to the measurement system or the aforementioned grating arrangement made of first grating 5 and second grating 8. In principle, this facilitates a separation of the respective components of the test object from the components of the measurement system in the obtained measurement signals or in the evaluation result obtained in the detection plane. Sometimes, the method is also referred to as a self-calibration method.

In practice, further, there is also the need for a moiré measurement of so-called anamorphic imaging systems. Here, anamorphic imaging is understood to mean imaging which produces a distorted image of the object and which is not an instance of similarity imaging (i.e. which is not representable by a combination of displacement, rotation, mirroring and scaling). In a special case, such an anamorphic imaging system may be e.g. a projection lens which has different imaging scales along two mutually different axes.

A problem occurring when measuring such anamorphic imaging systems in conjunction with the above-described calibration method is that—as indicated in FIG. 11 (in which components which are analogous or have substantially the same function to those in FIG. 8 and FIG. 10 are denoted by corresponding reference signs which, however, have been appended by an apostrophe)—in the different measurement positions brought about during the calibration, there is no longer an originally present fit or correspondence between the moiré mask and these test structures in specific measurement positions (which e.g. are brought about by rotations) as a consequence of the distorted imaging of the test structures, with the consequence that a correct evaluation of the measurement signals becomes difficult or even impossible and the aforementioned calibration method is no longer applicable.

With regard to the prior art, reference is made purely by way of example to U.S. Pat. No. 6,816,247 B1.

SUMMARY

Against the aforementioned background, it is an object of the present invention to provide an appliance for the moiré measurement of an optical test object, which facilitates a correct moiré measurement which takes into account possible manufacturing faults of the measurement system, in particular including the above-described calibration method, even in the case of anamorphic imaging systems.

This object, inter alia, is achieved by an arrangement according to the features recited in the independent claims, below.

An appliance for the moiré measurement of an optical test object comprises:

a grating arrangement made of a first grating which is positionable in the optical beam path upstream of the test object and which comprises test structures to be imaged and a second grating which is positionable in the optical beam path downstream of the test object; and an evaluation unit comprising at least one detector, for evaluating moiré structures produced by superposition of the two gratings in a detection plane situated downstream of the second grating in the optical beam path;

wherein the test object is an anamorphic imaging system; and wherein the respective grating periods of the first grating and of the second grating are selected in such a way that the grating period of the second grating corresponds to a common multiple or a common divisor of the respective periods of two test structure images of the test structures of the first grating produced by the imaging system in two different measurement positions, wherein the two measurement positions differ in respect of the relative position of grating arrangement and test object.

Here it is possible, for example (without, however, the invention being restricted thereto), to obtain respectively one measurement result in the at least two measurement positions, in which the light intensity transmitted through the grating arrangement is at a maximum in the case of aberration-free imaging by the test object and reduced in the case where optical aberrations of the test object are present. In other embodiments (where use is made of so-called "inverse" structures which lead to the greatest possible shadowing in the case of aberration-free imaging), a signal minimum may conversely also be obtained for the aberration-free imaging.

Here, in line with conventional terminology, "anamorphic" imaging is understood to mean imaging which produces a distorted image of an object and which does not represent similarity imaging (such that the imaging is not representable by a combination of displacement, rotation, mirroring and scaling). An example of an anamorphic imaging system is a projection lens which has different imaging scales along two different axes.

In particular, the invention incorporates the concept of providing such a design of the moiré mask in the grating arrangement made of a first grating having the respective test structures and a second grating forming the moiré mask within an appliance for the moiré measurement that, in the case of aberration-free imaging by the test object, there is correspondence for at least some lines (preferably as many lines as possible) of the image of the test structures produced during the anamorphic imaging with the structures present on the moiré mask in each of the at least two individual measurement positions.

By way of example, in one exemplary embodiment, it is possible for instance to select a design of the moiré mask in which, in a second measurement position which is rotated in relation to the first initial measurement position, only every second line on the moiré mask still "sees light" whereas the lines situated therebetween "remain dark"; i.e., expressed differently, the period of the moiré mask is twice the size of the period of the images of the respective test structures. In this case, a correct evaluation is possible, wherein use is made of the fact that, even in the scenario described above, the brightness occurring in the detection plane still is at a maximum in the case of a perfect fit of the images of the test structures to the structures on the moiré mask but said brightness is at a minimum in the case of the offset thereof by half a period, wherein, further, a decrease in the entire luminous energy in the detection plane, occurring overall, is not important here.

Expressed differently, the invention contains the concept of designing the grating arrangement made of the first grating positioned upstream of the test object in the optical beam path and the second grating positioned downstream of the test object in the optical beam path within an appliance for the moiré measurement such that the calibration method described at the outset is facilitated in each case in combination with the test object to be measured, even in the case of anamorphic imaging by the test object; i.e., a correct moiré measurement or evaluation of the signals obtained here in the plurality of rotational and/or displacement positions between the measurement arrangement comprising said grating arrangement on the one hand and the test object on the other hand is possible.

Here, the invention further also contains the concept of selecting the relevant rotational positions in a suitable manner to the extent that a light loss which is too great is avoided in the respective specific application situation, i.e. not leaving large regions of the respective gratings of the grating arrangement unused where possible.

Further, the invention also contains the concept of suitably selecting the respective line widths of the structures on the moiré mask on the one hand and of the grating positioned upstream of the test object on the other hand. By way of example, what is possible to be avoided here—as will still be explained in more detail below—is that one and the same line on the moiré mask is simultaneously exposed by two lines or test structures of the first grating in specific measurement positions. In particular, it is possible to avoid an unwanted overlap of lines that do not fit to one another arising.

In accordance with one embodiment, the respective grating periods of the first grating and of the second grating are selected in such a way that, for the two measurement positions, the light intensity transmitted through the grating arrangement is either at a maximum or at a minimum in the case of aberration-free imaging by the test object.

In accordance with one embodiment, the at least two measurement positions differ by a relative rotation of the test object and the grating arrangement in relation to one another and/or by a relative translation of the test object and the grating arrangement in relation to one another.

In accordance with one embodiment, the at least two measurement positions are selected in such a way that the imaging scales, in each case effective for these measurement positions, have a rational relationship with respect to one another.

In accordance with one embodiment, line widths of test structures on the first grating and line widths of structures on the second grating are selected in such a way that, for the at least two measurement positions, no line on the second grating is exposed simultaneously by two lines of the test structures of the first grating.

In accordance with one embodiment, line widths of test structures on the first grating and line widths of structures on the second grating are selected in such a way that, for the at least two measurement positions, respectively all pairs of test structure lines, contributing to the imaging, on the first grating and lines on the second grating have the same dependence on optical aberrations of the test object in respect of the luminous energy transmitted through the respective line pair. Expressed differently, all exposed lines on the second grating or the moiré mask which contribute to the imaging are in phase to the extent that when a line on the second grating just has a maximum brightness or maximum shadowing, every other line on the second grating contributing to the measurement signal likewise has a maximum brightness or maximum shadowing. What this avoids is that a line on the second grating is completely illuminated at a specific instant while another line on the second grating is only partly illuminated at the same instant.

In accordance with one embodiment, the optical test object is a projection lens of a microlithographic projection exposure apparatus.

In accordance with one embodiment, the optical test object is designed for operation at an operating wavelength of less than 30 nm, in particular less than 15 nm.

In accordance with a further aspect, an appliance for the moiré measurement of an optical test object comprises:

a grating arrangement made of a first grating which is positionable in the optical beam path upstream of the test object and which comprises a test structure and a second grating which is positionable in the optical beam path downstream of the test object, and an evaluation unit comprising at least one detector, for evaluating moiré structures produced by superposition of the two gratings in a detection plane situated downstream of the second grating in the optical beam path;

wherein the test object is an anamorphic imaging system; and wherein the first grating and the second grating are matched to one another in such a way that a measurement result is obtained in the detection plane, said measurement result depending on possible optical aberrations of the test object in such a way that the evaluation of this measurement result facilitates distinguishing aberration-free imaging by the test object from aberration-afflicted imaging by the test object for at least two measurement positions which differ in respect of the relative position of grating arrangement and test object.

The invention further relates to a method for the moiré measurement of an optical test object, wherein the test object is an anamorphic imaging system and wherein the method comprises the following steps:

positioning a first grating having test structures to be imaged in the optical beam path upstream of the test object and positioning a second grating in the optical beam path downstream of the test object; and evaluating moiré structures produced by superposition of the two gratings in a detection plane situated in the optical beam path downstream of the second grating, in at least two measurement positions which differ from one another in respect of the relative position of grating arrangement and test object;

wherein the respective grating periods of the first grating and of the second grating are selected in such a way that the grating period of the second grating corresponds to a common multiple or a common divisor of the respective periods of two test structure images of the test structures of the first grating produced by the imaging system in the two different measurement positions.

In accordance with one embodiment, the first grating and the second grating are rotated by mutually different angles of rotation in a second measurement position relative to a first measurement position.

In accordance with one embodiment, the relationship $$\theta_{img} = \arctan\left(\frac{\beta_y}{\beta_x} \cdot \tan\theta_{obj}\right)$$

applies for these angles of rotation, wherein $\theta_{obj}$ denotes the angle of rotation of the first grating, $\theta_{img}$ denotes the angle of rotation of the second grating and fix, $\beta_x$, $\beta_y$ denote the imaging scales of the test object in two mutually perpendicular directions.

Further configurations of the invention can be gathered from the description and the dependent claims.

The invention is explained in greater detail below on the basis of exemplary embodiments illustrated in the accompanying figures.

BRIEF DESCRIPTION OF THE DRAWINGS

FIGS. 4A, 4C and 4E show test structures contained in three orientations of a first grating and FIGS. 4B, 4D and 4F show their respective structure images;

FIG. 5 shows a test structure image for a simple example of an anamorphic imaging system;

FIG. 7A and FIG. 7B show respective views of exemplary measurement structures for anamorphic projection lenses, with respectively differing imaging scales;

DETAILED DESCRIPTION

Figure 8:
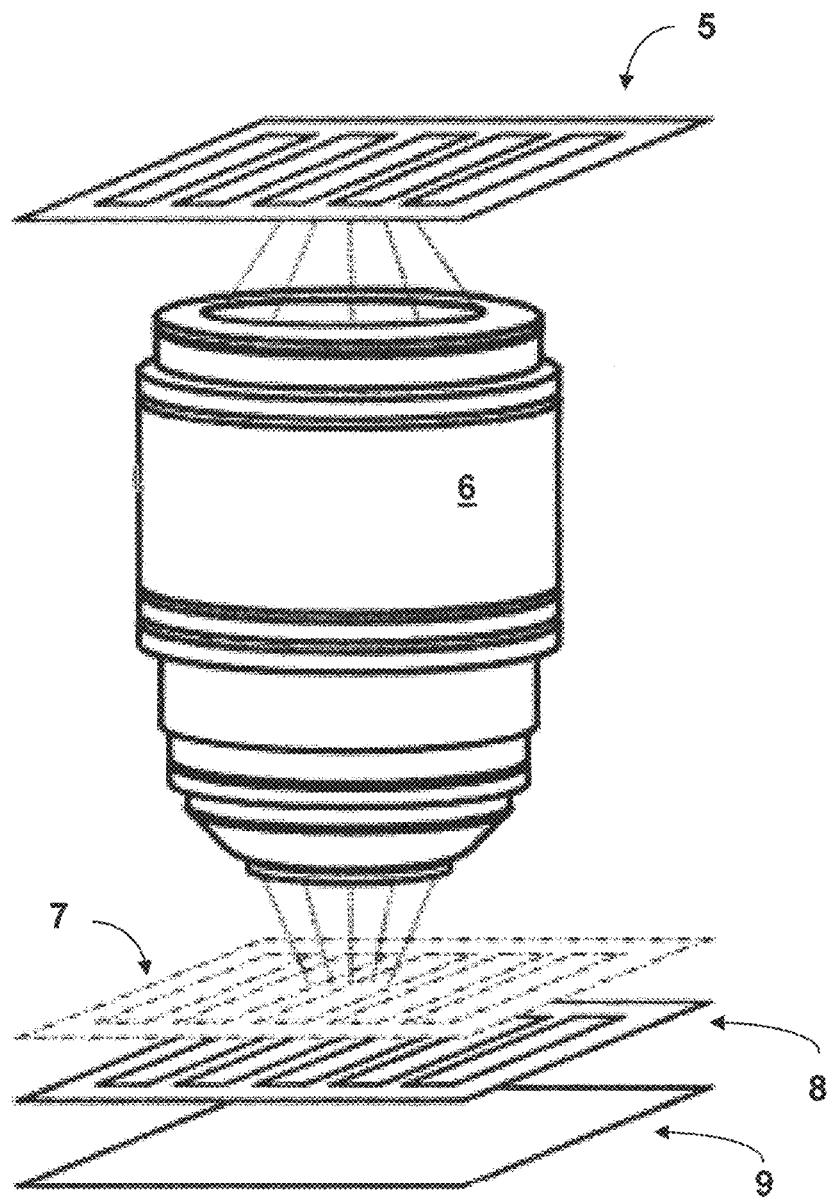
FIG. 8 shows a schematic illustration for explaining the structure of a conventional appliance for the moiré measurement of an optical test object.
Figure 9:
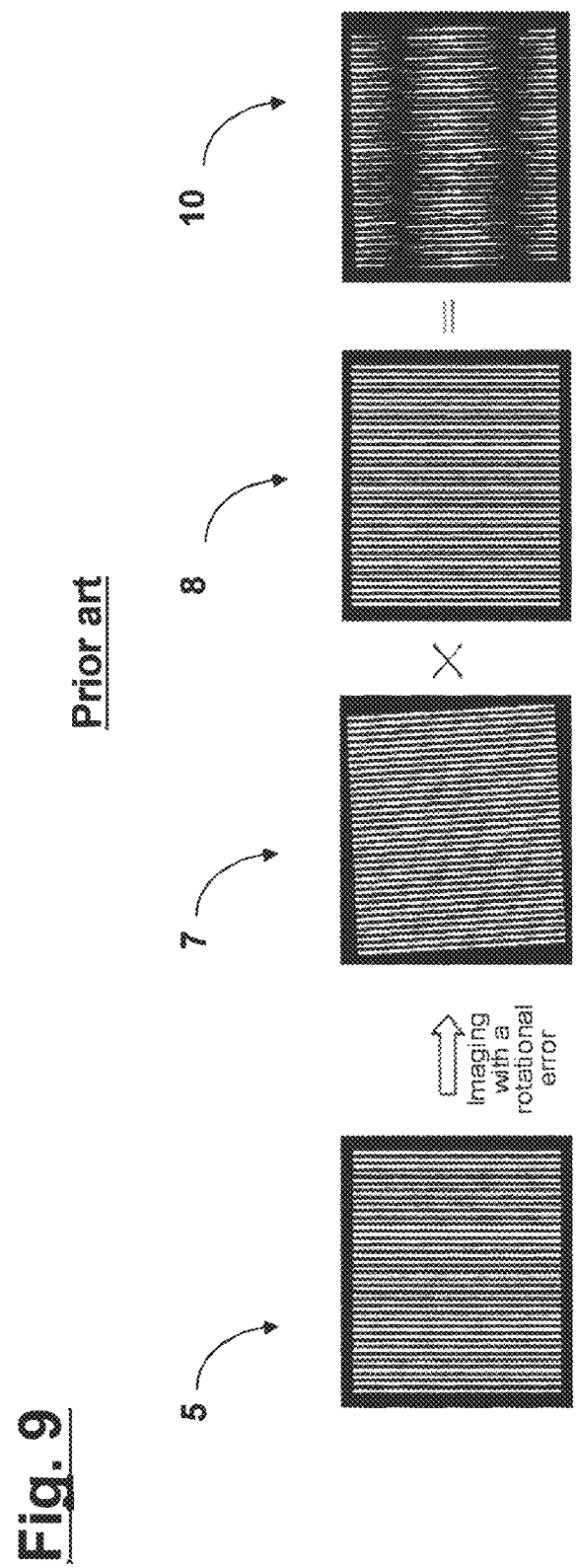
FIG. 9 shows a schematic illustration for explaining the functional principle of a conventional appliance for the moiré measurement of an optical test object.

Below, different embodiments of the invention are described with reference to FIGS. 1 to 6, in each case proceeding from the basic structure for the moiré measurement described on the basis of FIGS. 8 to 10.

Figure 1:
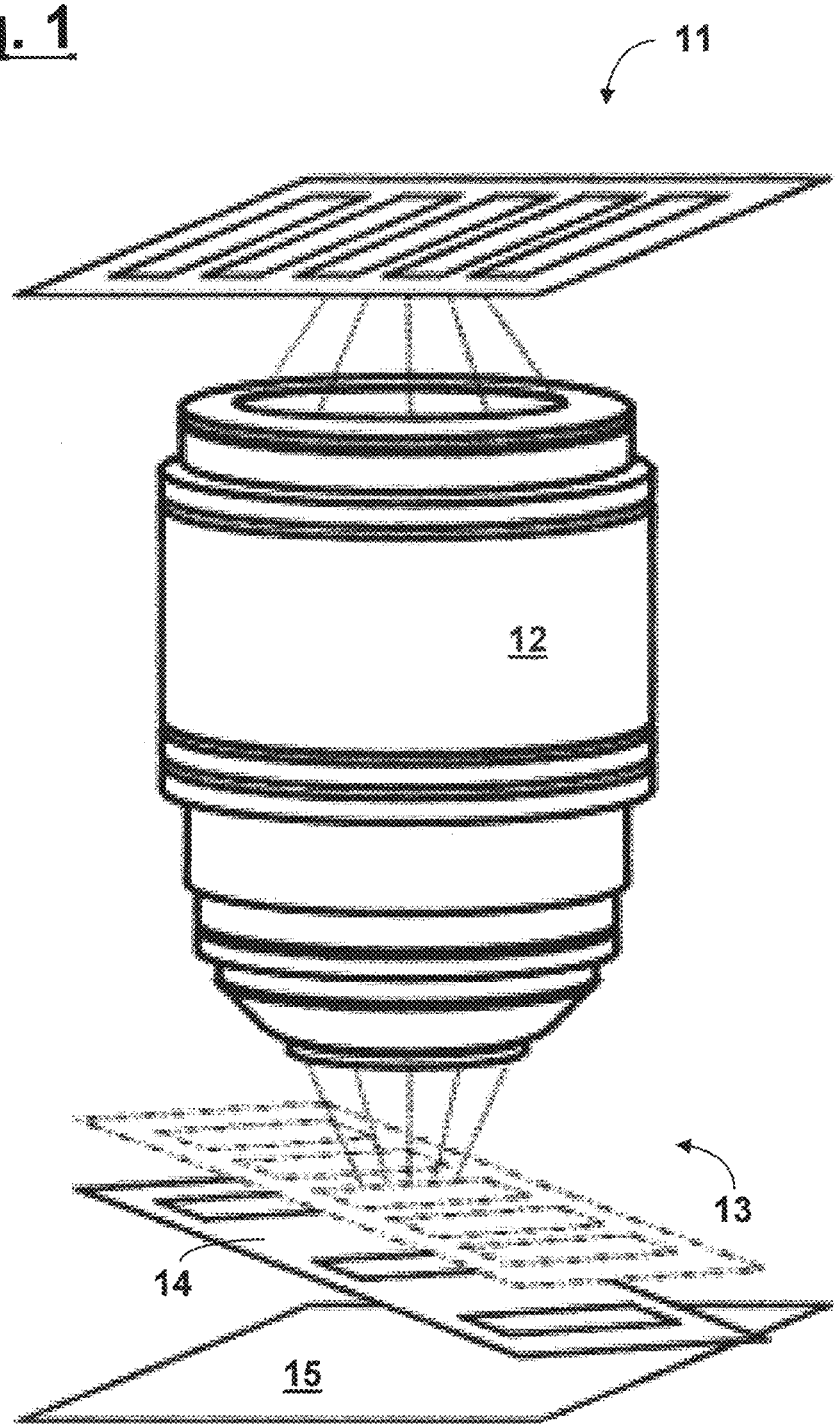
FIG. 1 shows a schematic illustration of an appliance for moiré measurement for explaining a first embodiment of the present invention.

In accordance with FIG. 1, an appliance for the moiré measurement of an optical test object 12 comprises a grating arrangement made of a first grating 11 which is positionable in the optical beam path upstream of the test object 12 and which comprises test structures to be imaged and a second grating 14 which is positionable in the optical beam path downstream of the test object 12, and an evaluation unit comprising at least one detector 15, for evaluating moiré structures produced by superposition of the two gratings in a detection plane situated downstream of the second grating 14 in the optical beam path. The produced image of the test structures contained in the first grating 11 is denoted by "13". As a rule, the planes of the test structure image 13 on the one hand and of the second grating 14 or of the moiré mask on the other hand also coincide here and are depicted with spatial separation only for the purposes of a better illustration. Furthermore, the detector 15 should also follow as closely as possible in the optical beam path downstream of the image plane in which the test structure image 13 is produced.

Figure 10:
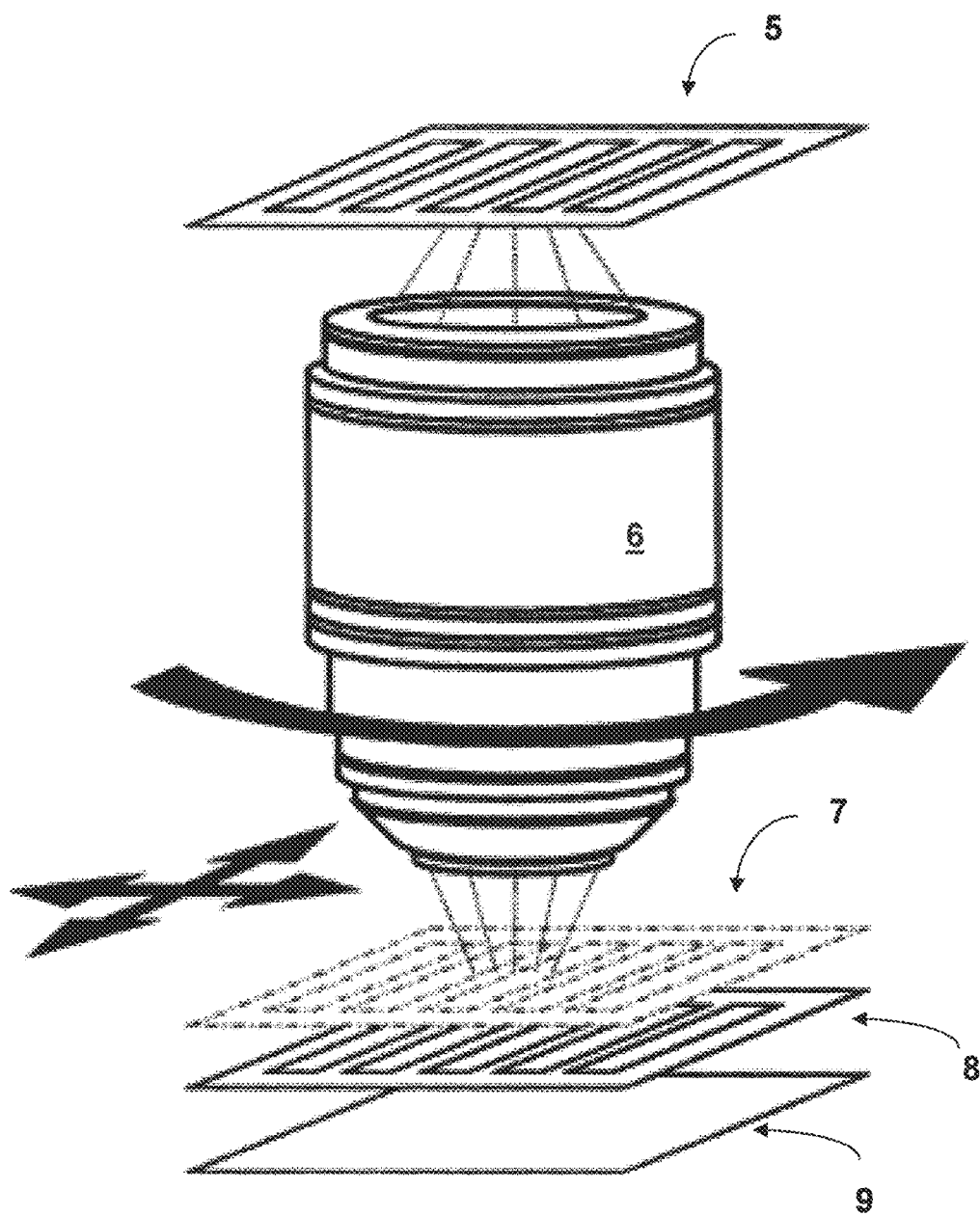
FIGS. 10 and 11 show schematic illustrations for explaining conventional calibration methods for measuring imaging systems and anamorphic imaging systems, respectively.
Figure 11:
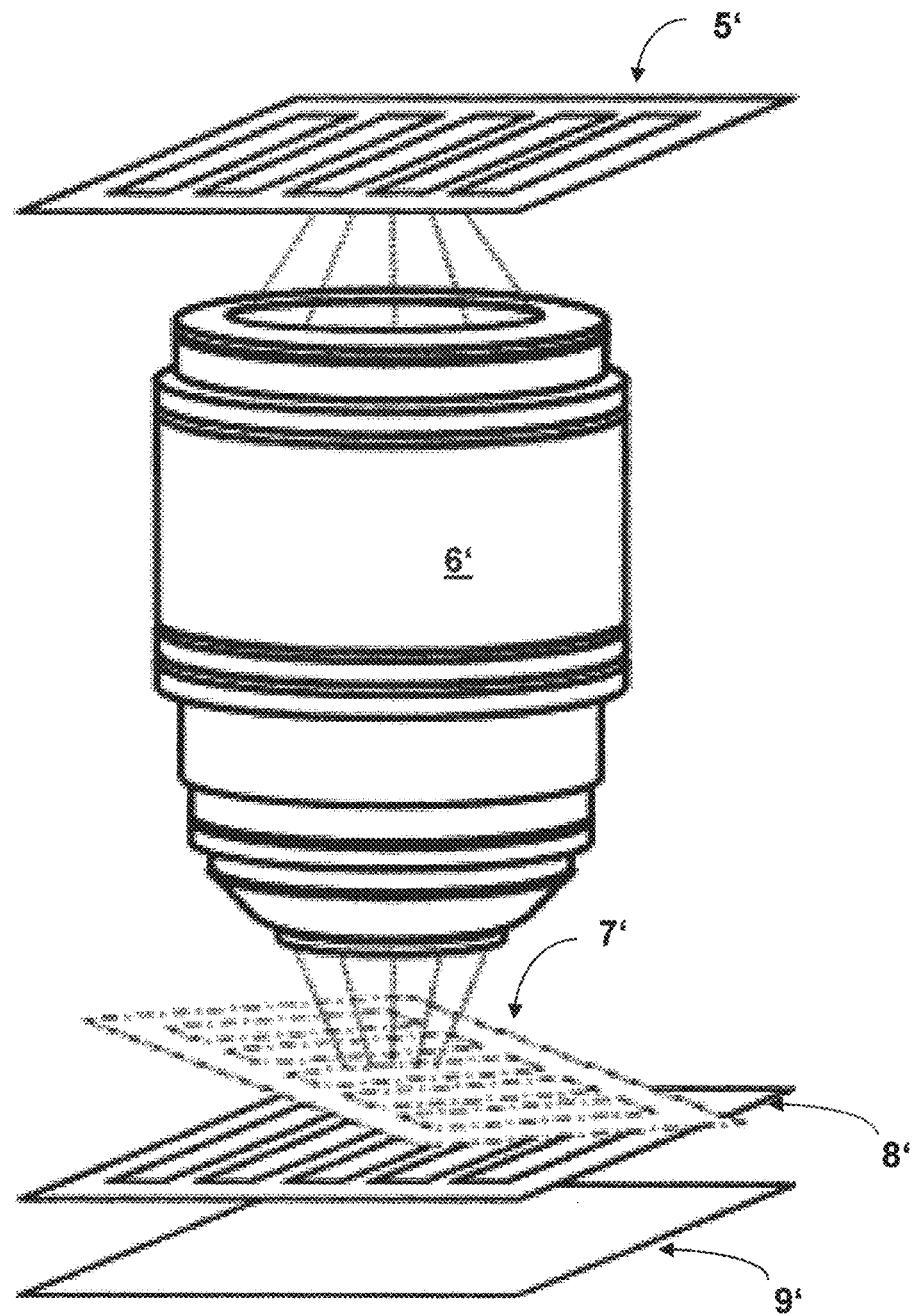

What is common to the exemplary embodiments described below is that, proceeding from the basic structure for the moiré measurement described on the basis of FIGS. 8 to 10, the grating arrangement made of the first grating 11 and the second grating 14 (i.e. the moiré mask) is designed in such a way that, in each case in combination with the anamorphic test object or projection lens to be measured, the calibration method described at the outset on the basis of FIG. 10 is facilitated; i.e., a correct moiré measurement or evaluation of the signals obtained here is possible in a plurality of rotational and/or displacement positions between the measurement arrangement comprising said grating arrangement on the one hand and the test object 12 on the other hand.

In each case, this is achieved by virtue of the first grating 11 and the second grating 14 being fitted to one another in such a way that an evaluation result is obtained in the detection plane, the light intensity transmitted through the grating arrangement being at a maximum in the case of aberration-free imaging by the test object 12 and being reduced in the case of present optical aberrations of the test object 12 in said evaluation result for at least two measurement positions (which are selectable for calibration purposes) which differ in respect of the relative position of grating arrangement and test object 12.

Below, the assumption is initially made that the ratio of the periods of the test structure images of the first grating 11 in two different measurement positions, which differ in respect of the relative position of grating arrangement and test object 12, is rational and hence representable as $$\frac{p_{img,1}}{p_{img,2}} = \frac{P}{Q}, \quad (1)$$

where P and Q are integers and where $p_{img,1}$ and $p_{img,2}$ denote the periods of the test structure images in the first measurement position and a second measurement position, respectively. Then, the period $p_{mask}$ of the structures or of the line grating on the second grating 14 (i.e. the moiré mask) may be selected to be an integer multiple of the periods $p_{img,1}$ and $p_{img,2}$ such that, for example, the following applies:

$$p_{mask} = Q \cdot p_{img,1} = P \cdot p_{img,2} \quad (2)$$

Then, each Q-th line of the test structures contained on the first grating 11 in the first measurement position and each P-th line in the second measurement position makes a meaningful contribution to the moiré signal.

Interference signals from line combinations not fitting to one another can be reduced by the selection of the line widths on the basis of the following consideration: All lines of the test structures contained on the first grating 11, which are not mapped perfectly onto a line on the second grating 14 or the moiré mask in the case of aberration-free imaging are considered. From the position of these line images, the smallest distance d to one of the lines on the second grating 14 or the moiré mask is considered in each case. Now, if $d_{min,1}$ and $d_{min,2}$ are used to denote the minima of all of these smallest distances in the two measurement positions (i.e. the smallest distances of "non-fitting line combinations"), it is possible, by selecting the line widths $a_{mask}$ (the lines on the moiré mask) and $a_{obj}$ (the lines on the first grating 11) in accordance with $$a_{mask} + a_{img}(a_{obj}, \theta_{obj,1}, M) < d_{min,1} \quad (3)$$

and $$a_{mask} + a_{img}(a_{obj}, \theta_{obj,2}, M) < d_{min,2} \quad (4),$$

to ensure that there are no overlaps of lines "that do not fit to one another". Here, $a_{img}$ denotes the line width of the test structure images, $\theta_{obj,1}$ and $\theta_{obj,2}$ denote the rotational angle in the two measurement positions and M denotes the transformation during the mapping from object to image. This method is restricted by the imaging of the test structures by the test object 12 and the width of a line image is bounded below by the resolution capacity of the projection optical unit (e.g. the diameter of the Airy disk).

Figure 2:
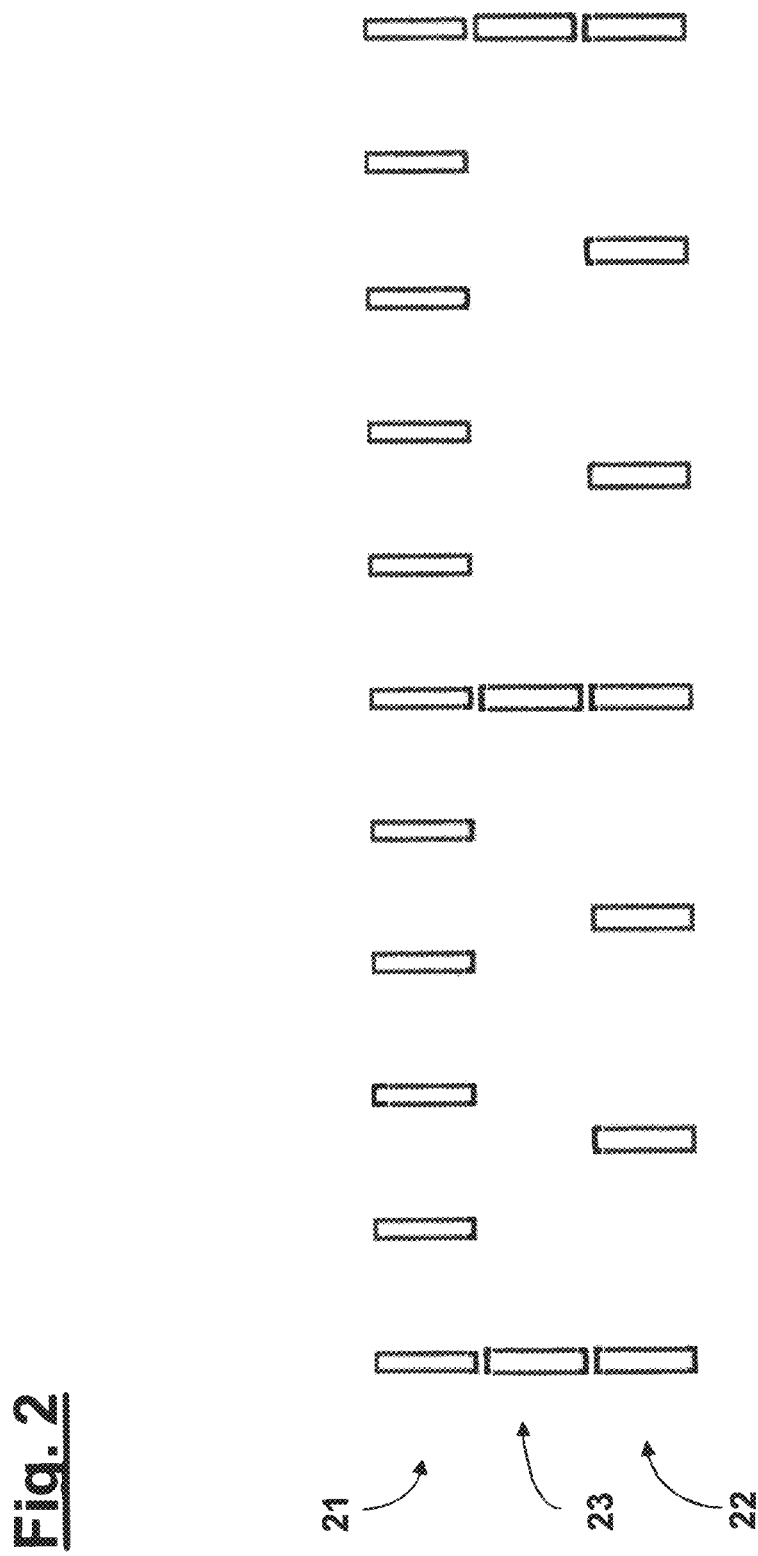
FIG. 2 shows a design example for the second grating.

FIG. 2 shows an example for designing the second grating 14 or the moiré mask if the ratio of the periods of the test structure images in the aforementioned two measurement positions is 3:5, where "21" shows the period of the test structure image for "measurement position 1", "22" shows the period of the test structure image for "measurement position 2" and "23" shows the period of the lines on the second grating 14 or the moiré mask. The period of the second grating 14 or of the moiré mask in this case corresponds to a common multiple of the periods of the test structure images in the two aforementioned measurement positions.

Figure 3:
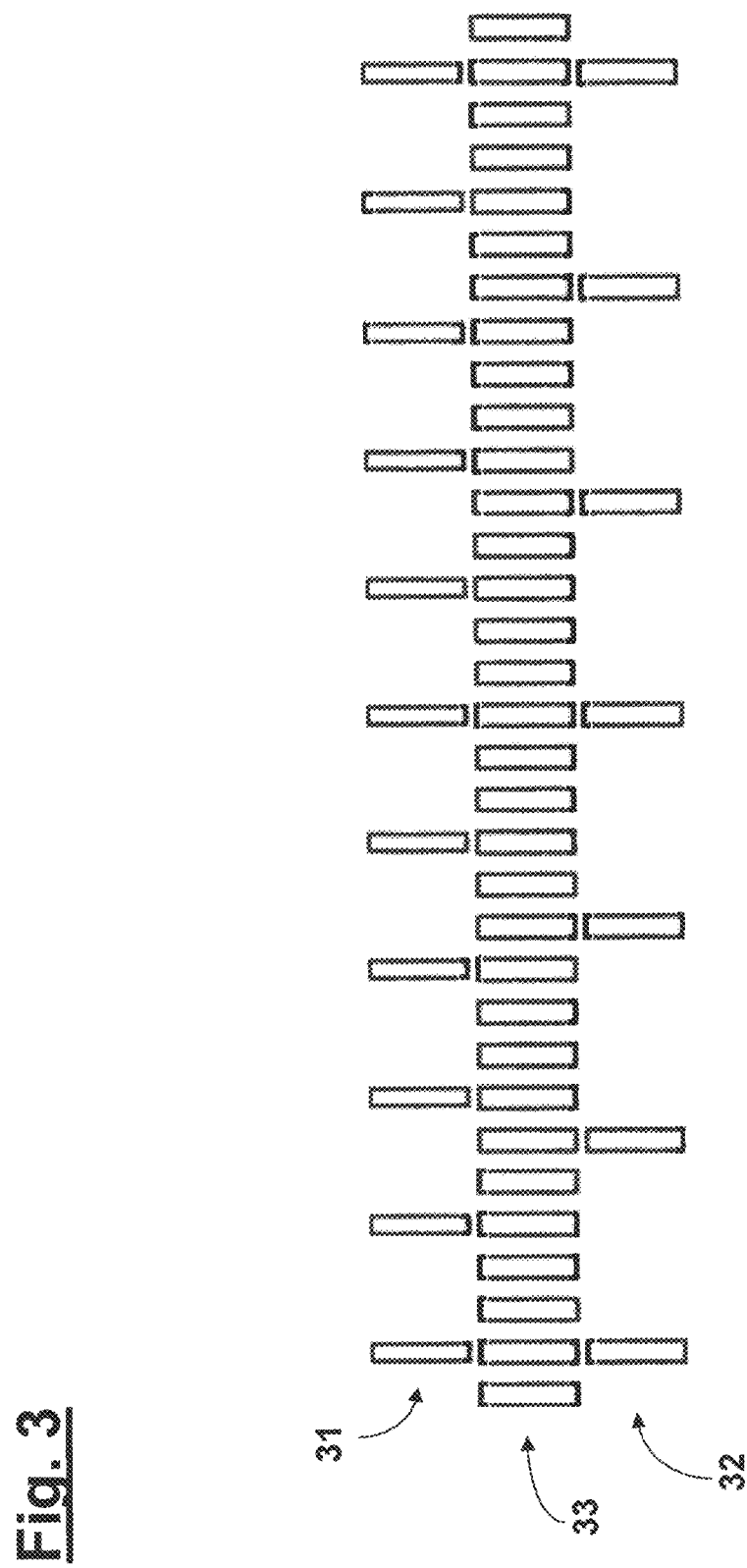
FIG. 3 shows a design example for the second grating of an appliance for moiré measurement.

A likewise advantageous embodiment, schematically indicated in FIG. 3, corresponds to the selection of the period of the second grating 14 or of the moiré mask as a common divisor of the periods of the test structure images in the two measurement positions. If the ratio of the periods of the test structure images of the first grating 11 is rational in both measurement positions and hence representable in accordance with the aforementioned Equation (1), it is also possible to carry out a moiré measurement in a meaningful way if the period of the line grating on the second grating 14 or the moiré mask is selected as $$p_{mask} = \frac{p_{img,1}}{P} = \frac{p_{img,2}}{Q}. \quad (5)$$

Then, in the first measurement position, each P-th line n contributes to the moiré signal in a meaningful manner and, in the second measurement position, each Q-th line of the structures present on the second grating 14 contributes to the moiré signal in a meaningful manner. FIG. 3 shows a corresponding example for designing the second grating 14 or the moiré mask if the ratio of the periods of the test structure images in the two measurement positions is 3:5, where "31" shows the period of the test structure image for "measurement position 1", "32" shows the period of the test structure image for "measurement position 2" and "33" shows the period of the lines on the second grating 14 or the moiré mask. As already described in conjunction with FIG. 2, the occurrence of interference signals may also be suppressed here by a suitable selection of the line widths in accordance with Equations (3) and (4).

A special case of the general affine transformation is a map of the form $$\begin{pmatrix} x_{img} \\ y_{img} \end{pmatrix} = \begin{pmatrix} \beta_x & 0 \\ 0 & \beta_y \end{pmatrix} \cdot \begin{pmatrix} x_{obj} \\ y_{obj} \end{pmatrix} + \begin{pmatrix} x_0 \\ y_0 \end{pmatrix}, \quad (6)$$

with the transformation matrix $$M = \begin{pmatrix} \beta_x & 0 \\ 0 & \beta_y \end{pmatrix}.$$

Such imaging has the imaging scales $\beta_x$ and $\beta_y$ along the x-direction and the y-direction. Without loss of generality, the assumption is made here that the imaging contains no rotation (otherwise, it is possible to compensate the rotation of the imaging by a rotation of the coordinate system in the image plane).

In the case assumed above, there are two measurement positions or rotational positions of the test structures contained on the first grating 11, in which the orientation of the test structures and the orientation of the test structure images are identical, namely if the lines of the test structures extend parallel to the x-axis or to the y-axis. Then, for the period $p_{img}$ and the line width $a_{img}$ of the test structure images, $p_{img}=\beta_x \cdot p_{obj}$ and $a_{img}=\beta_x \cdot a_{obj}$ apply to lines extending parallel to the y-axis and $p_{img}=\beta_y \cdot p_{obj}$ and $a_{img}=\beta_y \cdot a_{obj}$ apply to lines extending parallel to the x-axis. Therefore, the ratio of the periods of the test structure images respectively contained in the measurement positions is $$k = \frac{\beta_x}{\beta_y}.$$

These rotational positions lend themselves for a calibration measurement, wherein the moiré mask may be suitably designed using the methods described above such that it fits to this ratio of the periods.

In FIGS. 4A-4F, the associated test structure images (FIG. 4B, 4D and 4F) are respectively schematically illustrated for three different orientations of the first grating 11 or the test structures (FIGS. 4A, 4C and 4E) contained therein, wherein an imaging scale of 1:1 is assumed along the x-axis and an imaging scale of 1:2 is assumed along the y-axis. Here, "41" denotes the test structure with lines parallel to the y-axis, "42" denotes the associated test structure image, "43" denotes the test structure with lines parallel to the x-axis, "44" denotes the associated test structure image, "45" denotes the test structure with diagonal lines and "46" denotes the associated test structure image. The test structures and the images thereof only have the same orientation if the lines lie parallel to a coordinate axis, in accordance with FIG. 4A or FIG. 4B.

If two measurement or rotational positions, in which the lines of the test structures with period $p_{obj}$ include the angle $\theta_{obj,1}$ and include the angle $\theta_{obj,2}$ in alternation, are considered, the imaging described above with the asymmetric imaging scale causes the periods of the test structure images in the two measurement positions to be $$p_{img,1} = p_{obj} \cdot \frac{\beta_x \cdot \beta_y}{\sqrt{\beta_x^2 \cdot \cos^2\theta_{obj,1} + \beta_y^2 \cdot \sin^2\theta_{obj,1}}} \quad (7)$$

$$p_{img,2} = p_{obj} \cdot \frac{\beta_x \cdot \beta_y}{\sqrt{\beta_x^2 \cdot \cos^2\theta_{obj,2} + \beta_y^2 \cdot \sin^2\theta_{obj,2}}}. \quad (8)$$

By way of a suitable selection of the rotational positions $\theta_{obj,1}$ and $\theta_{obj,2}$, it is thus possible to set the ratio of the periods $$\frac{p_{img,2}}{p_{img,1}} = \frac{\sqrt{\beta_x^2 \cdot \cos^2\theta_{obj,1} + \beta_y^2 \cdot \sin^2\theta_{obj,1}}}{\sqrt{\beta_x^2 \cdot \cos^2\theta_{obj,2} + \beta_y^2 \cdot \sin^2\theta_{obj,2}}} \quad (9)$$

to any value between $$\frac{\beta_x}{\beta_y} \text{ and } \frac{\beta_y}{\beta_x}$$

and correspondingly maximize the number of evaluable lines. To this end, the ratio of the periods $$k = \frac{p_{img,2}}{p_{img,1}} = \frac{P}{Q}$$

is set in such a way that the numbers P and Q (which are respectively integers) become as small as possible.

Then, in general, the orientation $\theta_{img}$ of the images of the test structure lines no longer corresponds to the orientation $\theta_{obj}$ of the lines of the test structures in the object plane. The following relationship applies:

$$\theta_{img} = \arctan\left(\frac{\beta_y}{\beta_x} \cdot \tan\theta_{obj}\right). \quad (10)$$

If the orientation of the test structures in the object plane $\theta_{obj}$ is given, the orientation of the moiré mask in the image plane $\theta_{mask} = \theta_{img}$ is selected.

For a simple example of an anamorphic scale of $\beta_x = \frac{1}{4}$ and $\beta_y = \frac{1}{8}$, the measurement positions in which the lines are oriented parallel to the coordinate axes are well suited to a moiré measurement. The ratio of the two imaging scales is $$\frac{\beta_x}{\beta_y} = 2:1.$$

In the example, the period of the test structures contained on the first grating 11 is $p_{obj} = 8$ μm and the period of the lines on the second grating 14 or the moiré mask is $p_{mask} = 1$ μm. Then, for $\theta_{obj,1} = 0°$ (lines parallel to the x-axis), the period of the image of the test structures is $p_{img,1} = 1$ μm and, for $\theta_{obj,1} = 90°$ (lines parallel to the y-axis), the period of the image of the test structures is $p_{img,1} = 2$ μm. Each line on the moiré mask contributes to the measurement signal in the first case and each second line on the moiré mask contributes to the measurement signal in the second case.

In this simple case, the associated orientations of the moiré mask in the image plane are $\theta_{mask,1} = 0°$ and $\theta_{mask,2} = 90°$.

The aforementioned situation is illustrated in FIG. 5, where "51" shows the period of the test structure image for the 90° position, "52" shows the period of the test structure image for the 0° position and "53" shows the period of the lines on the second grating 14 or the moiré mask. If the line width of the structures on the moiré mask is selected to be $a_{mask}$=0.5 µm and the line width of the test structures on the first grating 11 is selected to be $a_{obj}$=2 µm, interference signals by line combinations that do not fit to one another are suppressed. This result may be transferred to all test objects in which the ratio of the imaging scales $$\frac{\beta_x}{\beta_y}$$

has the value of 2:1 or 1:2.

Figure 6:
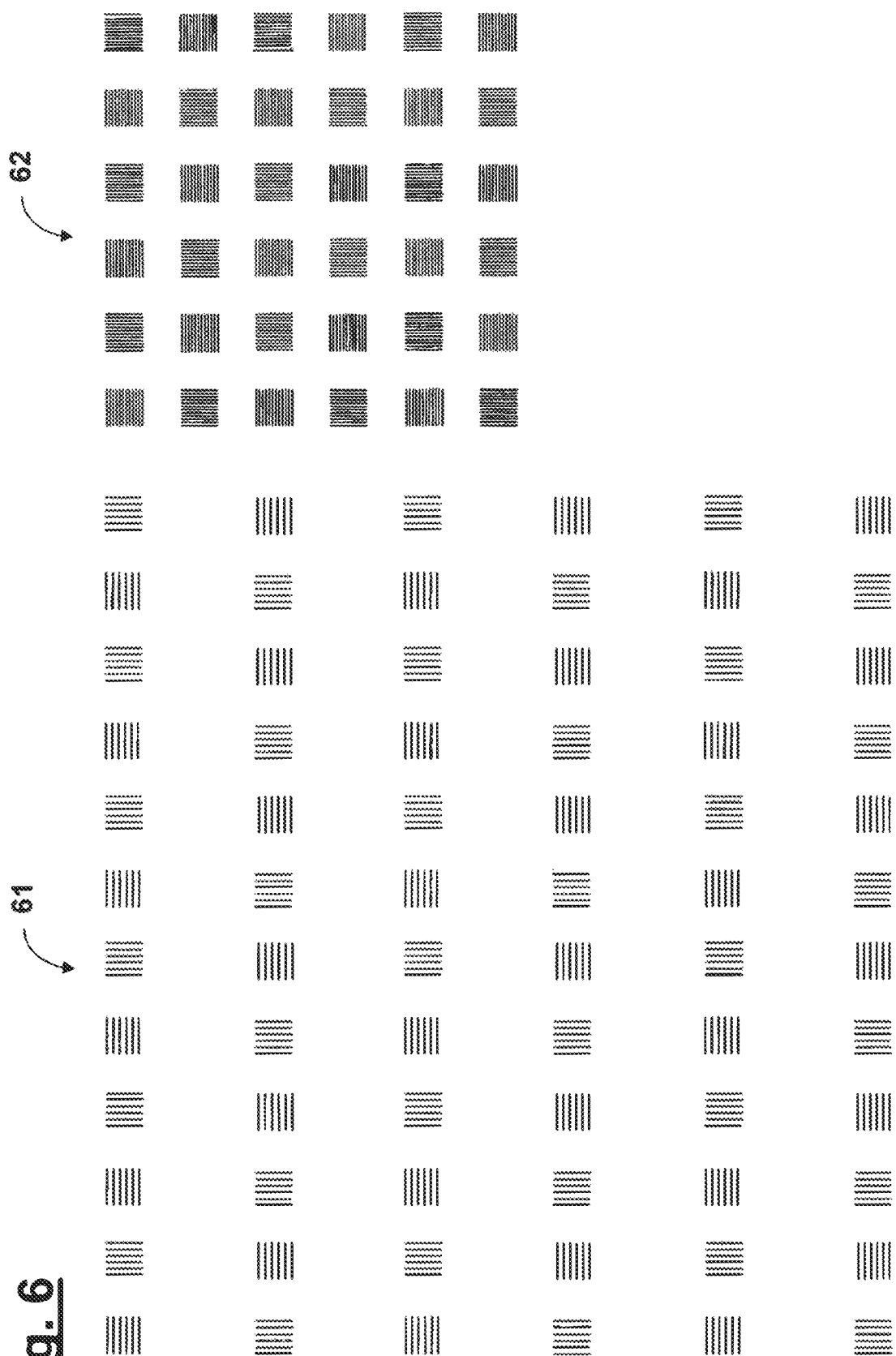
FIG. 6 shows an exemplary embodiment for two mask structures.

FIG. 6 shows an exemplary embodiment for two mask structures, fitting to one another, in the object plane (denoted by "61") and in the image plane (denoted by "62"), which can be used for anamorphic imaging, in which the imaging scale along the horizontal or x-axis is twice as large as the imaging scale along the vertical or y-axis. Each partial structure (a line grating) corresponds to a measurement point for a moiré measurement. The line width of the test structures is a quarter of the grating period and the line width on the moiré mask in the image plane is half the grating period. On the object mask, the distance between two adjacent partial structures is twice as large in the vertical direction as in the horizontal direction. The orientation of the lines respectively alternates between one measurement point and the adjacent measurement point. In the 0° rotational position, there is, for each partial structure in the object plane, precisely one structure fitting thereto on the moiré mask in the image plane. In the 90° rotational position, there are, albeit not for all partial structures but at least for some partial structures in the object plane, structures respectively fitting thereto in the image plane.

Preferably, in accordance with the invention, the respective measurement positions (which are then respectively selected in the calibration method) are also selected in a suitable manner depending on the specific application situation or the specific configuration of the test object. By way of example, if the anamorphic test object has imaging scales of $\beta_x$=25 and $\beta_y$=16, the ratio of the periods for lines with an orientation parallel to the coordinate axes is significantly less expedient than in the scenarios described above. The ratio of the two imaging scales is $$\frac{\beta_x}{\beta_y} = 25:16.$$

If the period of the test structures is $p_{obj}$=1 µm, the periods of the test structure images in the 0° position and in the 90° position respectively are $p_{img,1}$=25 µm and $p_{img,2}$=16 µm. The greatest common divisor of these two periods, which may therefore be selected as period of the lines on the moiré mask, is $p_{mask}$=1 µm. Hence, only every 25th line would contribute to the measurement signal for the 0° position and only every 16th line would contribute to the measurement signal for the 90° position.

If, instead, use is made of the rotational positions $\theta_{obj,1}$=0° and $\theta_{obj,2}$=68.629°, the periods of the test structure images are $p_{img,1}$=25 µm and $p_{img,2}$=16.667 µm and therefore have a ratio of 3:2. If $p_{mask}$=8.333 µm is selected as grating period on the moiré mask, then every second line contributes to the measurement signal in the first measurement position (0° position) and still every third line contributes to the measurement signal in the second measurement position (68.629° position).

In this case, the associated orientations of the moiré mask in the image plane are $\theta_{mask,1}$=0° and $\theta_{mask,2}$=58.557°.

The aforementioned result may be transferred to all test objects in which the ratio of the imaging scales $$\frac{\beta_x}{\beta_y}$$

has the value of 16:25 or 25:16.

For illustrative purposes, FIGS. 7a and 7b show schematic illustrations of overall views of a possible measurement structure in different positions when a calibration method is carried out. Here, FIG. 7A shows the structure for an anamorphic projection lens (test object 72) with an imaging scale of 1:1 in one direction and 2:1 in another direction, where "71" denotes the grating having the test structures and "73" denotes the second grating (moiré mask) positioned downstream of the test object in the optical beam path. FIG. 7B shows an analogous illustration for an anamorphic projection lens (test object 82) with imaging scales of 16:1 and 25:1 in the respective different directions, where "81" denotes the grating having the test structures and "83" denotes the second grating (moiré mask) positioned downstream of the test object in the optical beam path.

Even though the invention has been described on the basis of specific embodiments, numerous variations and alternative embodiments are apparent to the person skilled in the art, e.g. by combination and/or exchange of features of individual embodiments. Accordingly, such variations and alternative embodiments are concomitantly encompassed by the present invention, and the scope of the invention is restricted only within the meaning of the accompanying patent claims and the equivalents thereof.

What is claimed is:

1. Appliance for a moire measurement of an optical test object, comprising:
    a grating arrangement having
        a first grating positioned in an optical beam path upstream of the test object and which comprises test structures to be imaged and
        a second grating positioned in the optical beam path downstream of the test object; and
    at least one detector arranged to detect moire structures produced by superposition of the two gratings in a detection plane situated downstream of the second grating in the optical beam path,
    wherein the test object is an anamorphic imaging system, and
    wherein respective grating periods of the first grating and of the second grating are selected such that the grating period of the second grating corresponds to a common multiple or a common divisor of the respective periods of two test structure images of the test structures of the first grating produced by the imaging system in two different measurement positions, wherein the two measurement positions differ in relative grating arrangement position and test object position.

2. Appliance according to claim 1, wherein the respective grating periods of the first grating and of the second grating are selected such that, for the two measurement positions, light intensity transmitted through the grating arrangement is either at a maximum or at a minimum in case of aberration-free imaging by the test object.

3. Appliance according to claim 1, wherein the two measurement positions differ by a relative rotation of the test object and the grating arrangement in relation to one another and/or by a relative translation of the test object and the grating arrangement in relation to one another.

4. Appliance according to claim 1, wherein the two measurement positions are selected such that the imaging scales of the test object, in each case effective for these measurement positions, have a rational relationship with respect to one another.

5. Appliance according to claim 1, wherein line widths of test structures on the first grating and line widths of structures on the second grating are selected such that, for the two measurement positions, no line on the second grating is exposed simultaneously by two lines of the test structures of the first grating.

6. Appliance according to claim 1, wherein the test object is a projection lens of a microlithographic projection exposure apparatus.

7. Appliance according to claim 1, wherein the test object is designed for operation at an operating wavelength of less than 30 nm.

8. Appliance according to claim 7, wherein the test object is designed for operation at an operating wavelength of less than 15 nm.

9. Appliance according to claim 1, wherein the common multiple or the common divisor of the respective periods of the two test structure images of the test structures is an integer greater than 1.

10. Appliance for a moire measurement of an optical test object, comprising:
    a grating arrangement having
        a first grating positioned in an optical beam path upstream of the test object and which comprises test structures to be imaged and
        a second grating positioned in the optical beam path downstream of the test object; and
    an evaluation unit comprising at least one detector arranged to evaluate moire structures produced by superposition of the two gratings in a detection plane situated downstream of the second grating in the optical beam path,
    wherein the test object is an anamorphic imaging system,
    wherein the first grating and the second grating are matched to one another such that a measurement result is obtained in the detection plane and such that for at least two measurement positions, no line on the second grating is exposed simultaneously by two lines of test structures of the first grating, and
    wherein said measurement result depends on possible optical aberrations of the test object such that the evaluation of said measurement result facilitates distinguishing aberration-free imaging by the test object from aberration-afflicted imaging by the test object for the at least two measurement positions which differ in relative grating arrangement position and test object position.

11. Appliance according to claim 10, wherein the test object is a projection lens of a microlithographic projection exposure apparatus.

12. Method for a moire measurement of an optical test object, wherein the test object is an anamorphic imaging system and wherein the method comprises:
    positioning a first grating having test structures to be imaged in an optical beam path upstream of the test object and positioning a second grating in the optical beam path downstream of the test object;
    evaluating moire structures produced by superposition of the two gratings in a detection plane situated in the optical beam path downstream of the second grating, in at least two measurement positions which differ from one another in relative grating arrangement position and test object position; and
    selecting respective grating periods of the first grating and of the second grating such that the grating period of the second grating corresponds to a common multiple or a common divisor of the respective periods of two test structure images of the test structures of the first grating produced by the imaging system in the two different measurement positions.

13. Method according to claim 12, wherein the first grating and the second grating are rotated by mutually different angles of rotation in a second measurement position relative to a first measurement position.

14. Method according to claim 13, wherein the relationship $$\theta_{img} = \arctan\left(\frac{\beta_y}{\beta_x} \cdot \tan\theta_{obj}\right)$$

applies for these angles of rotation, wherein $\theta_{obj}$ denotes the angle of rotation of the first grating, $\theta_{img}$ denotes the angle of rotation of the second grating and $\beta_x$, $\beta_y$ denote the imaging scales of the test object in two mutually perpendicular directions.

15. Method of claim 12, wherein the common multiple or the common divisor of the respective periods of the two test structure images of the test structures is an integer greater than 1.

16. Method of claim 12, wherein selecting the respective grading periods includes selecting line widths of test structures on the first grating and line widths of structures on the second grating such that, for the at least two measurement positions, no line on the second grating is exposed simultaneously by two lines of the test structures of the first grating.

* * * * *

UNITED STATES PATENT AND TRADEMARK OFFICE
CERTIFICATE OF CORRECTION

| | |
|---|---|
| PATENT NO. | : 10,996,566 B2 |
| APPLICATION NO. | : 16/242388 |
| DATED | : May 4, 2021 |
| INVENTOR(S) | : Samaniego |

Page 1 of 1

It is certified that error appears in the above-identified patent and that said Letters Patent is hereby corrected as shown below:

In the Specification

Column 9, Line 41, Delete "(FIG." and insert -- (FIGS. --, therefor.

Signed and Sealed this
Ninth Day of November, 2021

Drew Hirshfeld
*Performing the Functions and Duties of the
Under Secretary of Commerce for Intellectual Property and
Director of the United States Patent and Trademark Office*